United States Patent [19]

Matsubishi

[11] Patent Number: 5,313,436
[45] Date of Patent: May 17, 1994

[54] ADDRESS TRANSITION DETECTING CIRCUIT

[75] Inventor: Noritsugu Matsubishi, Tokyo, Japan

[73] Assignee: OKI Electric Industry Co., Ltd., Tokyo, Japan

[21] Appl. No.: 986,693

[22] Filed: Dec. 8, 1992

[30] Foreign Application Priority Data

Dec. 10, 1991 [JP] Japan .................................. 3-326120

[51] Int. Cl.⁵ .......................... G11C 7/00; G11C 8/00
[52] U.S. Cl. ................................. 365/233.5; 365/49; 365/154; 365/190; 365/230.08
[58] Field of Search ...................... 365/233.5, 233, 203, 365/230.03, 154, 49, 189.01, 230.01, 190, 230.08

[56] References Cited

U.S. PATENT DOCUMENTS 4,833,643 5/1989 Hori ........................................ 365/49
5,226,005 7/1993 Lee et al. ............................... 365/49

OTHER PUBLICATIONS

"High-Speed IC Memory", Electronic Engineering vol. 28, No. 9, Aug. 8, 1986, pp. 34-41.
"On-Chip Cache Memory for Microprocessor (an Application of CAM)", The Institute of Electronics Communication Engineerings Technical Report, vol. 86, No. 191, SSD86-95, pp. 25-30.

Primary Examiner—Eugene R. LaRoche
Assistant Examiner—Son Mai
Attorney, Agent, or Firm—Spencer, Frank & Schneider

[57] ABSTRACT

An address transition detecting circuit which couples to a word line and an address signal line, which address signal line receives an address signal, is disclosed. The address transition detecting circuit has a word line control circuit and an address signal input circuit. The word line control circuit couples to the word line and discharges the word line. The address signal input circuit couples to the word line, the address signal line and the word line control circuit and stores an address data in response to the address signal. The address signal input circuit outputs an address transition signal to the word line in response to the address signal and the stored address data.

10 Claims, 7 Drawing Sheets

| STORED ADDRESS DATA | APPLIED ADDRESS DATA | MOS Tr 127 | MOS Tr 129 | MOS Tr 131 | MOS Tr 133 | WORD LINE 107 |
|---|---|---|---|---|---|---|
| 0 | 0 | ON | OFF | OFF | ON | L |
| 0 | 1 | OFF | OFF | ON | ON | H |
| 1 | 0 | ON | ON | OFF | OFF | H |
| 1 | 1 | OFF | ON | ON | OFF | L |

FIG. 3

ADDRESS TRANSITION DETECTING CIRCUIT

BACKGROUND OF THE INVENTION

The present invention relates to an address transition detecting circuit which detects a transition of an address signal. The address transition detecting circuit is composed of a memory circuit such as a static random access memory.

FIG. 6 is a circuit diagram showing the conventional address transition detecting circuit. This address transition detecting circuit 500 comprises a plurality of address signal transition detecting circuits 500-1 to 500-n and an OR circuit 503.

FIG. 7 is a circuit diagram of one of the address signal transition detecting circuits 500-1 to 500-n. The address signal transition detecting circuit 500-1 comprises a delay circuit 505 and an exclusive NOR gate 507. The delay circuit 505 has an input terminal connected to a node a which is connected to an address signal line and an output terminal connected to a node b. The delay circuit 505 receives an address signal on the address signal line and outputs a delayed address signal to the node b. The exclusive NOR gate 507 has two input terminals connected to the node a and the node b respectively and an output terminal connected to a node c. The exclusive NOR gate 507 receives the address signal and the delayed address signal and outputs an address transition pulse to the node c in response to the address signal and the delayed address signal.

Referring back to FIG. 6, the OR circuit 503 comprises n-type MOS transistors 511-1 to 511-n, a p-type MOS transistor 509 and an invertor 513. The gate of the MOS transistor 509 and the sources of the MOS transistors 511-1 to 511-n are connected to a ground. The source of the MOS transistor 509 is connected to a power supply. The drain of the MOS transistor 509 and the drains of the MOS transistors 511-1 to 511-n are commonly connected to an input terminal of the invertor 513. The gates of the MOS transistors 511-1 to 511-n are connected to the address signal transition detecting circuits 500-1 to 500-n respectively.

The invertor 513 outputs a "H" level signal when at least one of the MOS transistors 511-1 to 511-n receives the address transition pulse.

In the conventional address transition detecting circuit described above, the number of the n-type MOS transistors 511-1 to 511-n of the OR circuit 503 depends on the number of the address signal lines. Where the conventional address transition detecting circuit 500 has a lot of address signal lines, the OR circuit 503 has a lot of MOS transistors and therefore needs a large circuit area.

SUMMARY OF THE INVENTION

Accordingly, it is an object of the present invention to provide an address transition detecting circuit having no OR gate.

It is another object of the present invention to provide an address transition detecting circuit which detects the transition of the address signals quickly.

The address transition detecting circuit of the present invention couples to a word line and an address signal line which receives an address signal. The address transition detecting circuit has a word line control circuit and an address signal input circuit. The word line control circuit couples to the word line and discharges the word line. The address signal input circuit couples to the word line, the address signal line and the word line control circuit and stores an address data in response to the address signal. The address signal input circuit outputs an address transition signal to the word line in response to the address signal and the stored address data.

BRIEF DESCRIPTION OF THE DRAWINGS

FIG. 3 is a table showing address data, the state of transistors and electrical level of the output signal of the address transition detecting circuit according to the first embodiment of the present invention.

DETAILED DESCRIPTION OF THE PREFERRED EMBODIMENTS

A first embodiment of the present invention will now be described with reference to FIGS. 1, 2 and 3.

Figure 1:
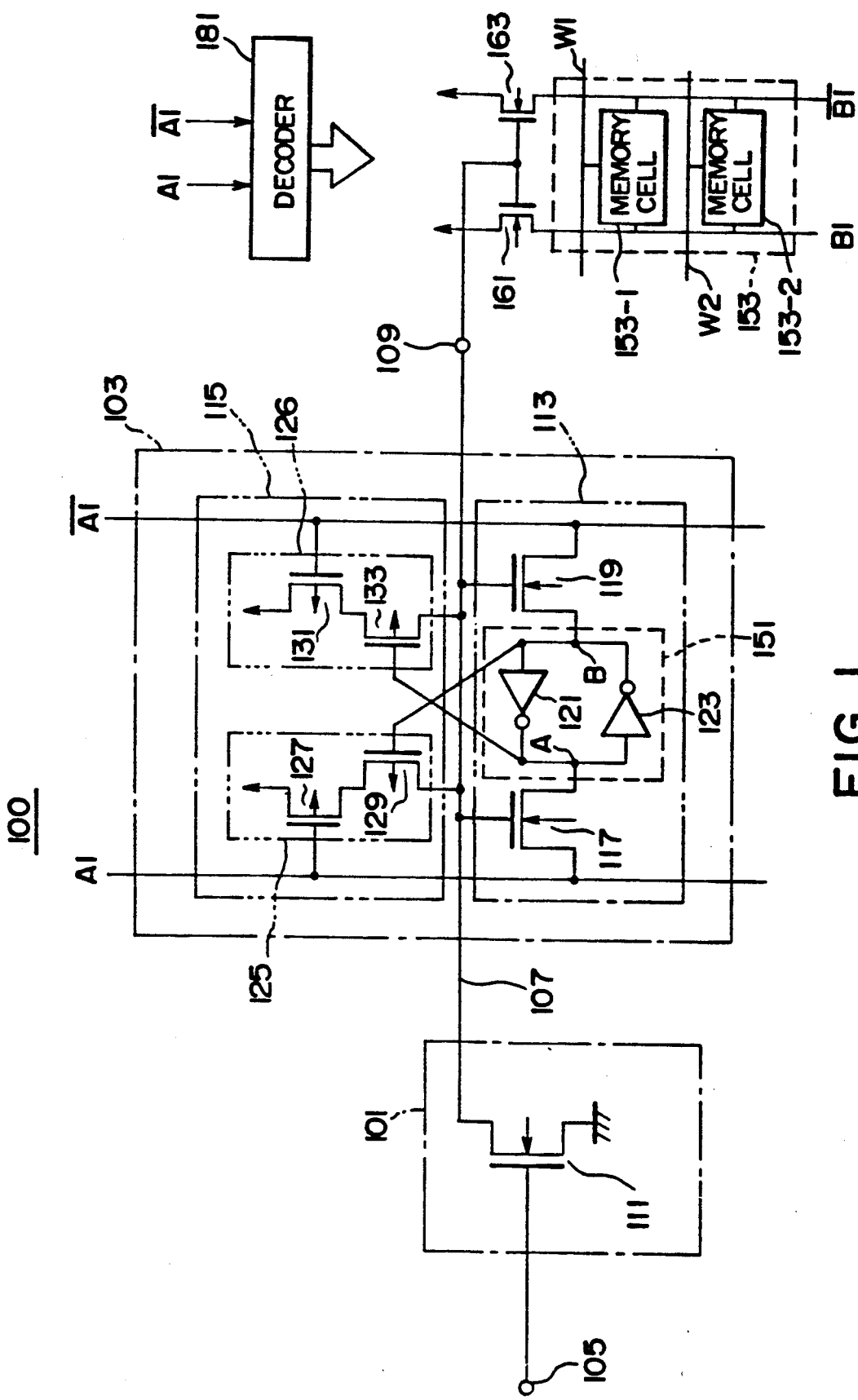
FIG. 1 is a circuit diagram showing an address transition detecting circuit according to a first embodiment of the present invention.

FIG. 1 is a circuit diagram showing the first embodiment of the present invention. An address transition detecting circuit 100 has a word line control circuit 101 and an address input circuit 103. The address transition detecting circuit 100 is coupled to a memory cell array 153.

The word line control circuit 101 is connected to a clock terminal 105 which receives a clock signal, and to a word line 107 connected to an output terminal 109. The word line control circuit 101 selectively applies ground voltage to the word line 107 (discharging the word line) in response to the clock signal.

The address input circuit 103 has an address storing circuit 113 and an address comparing circuit 115, each of which is connected to a pair of address signal lines A1 and barred A1 and the word line 107. The pair of address signal lines receives complementary address signals respectively. The address signals designate the location of a predetermined memory cell disposed in the memory cell array 153.

The address data storing circuit 113 has n-type MOS transistors 117 and 119 and inverters 121 and 123. An output terminal of the inverter 121 and an input terminal of the inverter 123 are commonly connected to a node A. An output terminal of the inverter 123 and an input terminal of the inverter 121 are commonly connected to a node B. The inverters 121 and 123 constitute a latch circuit 151 which stores address data in response to the address signals. The MOS transistor 117 has a gate connected to the word line 107, a source connected to the address signal line A1 and a drain connected to the node A. The MOS transistor 119 has a gate connected to the word line 107, a source connected to the address signal line barred A1 and a drain connected to the node B. The address data stored in the latch circuit 151 is renewed when each of the MOS transistors 117 and 119 is in the ON state.

The address comparing circuit 115 has first and second switching circuits 125 and 126, respectively. The first switching circuit 125 is comprised of p-type MOS transistors 127 and 129. The MOS transistor 127 has a gate connected to the address signal line A1, a drain connected to a source of the MOS transistor 129 and a source connected to a power supply. The MOS transistor 129 has a gate connected to the node B and a drain connected to the word line 107.

The second switching circuit 126 is comprised of p-type MOS transistors 131 and 133. The MOS transistor 131 has a gate connected to the address signal line barred A1, a drain connected to a source of the MOS transistor 133 and a source connected to the power supply. The MOS transistor 133 has a gate connected to the node A and a drain connected to the word line 107.

The memory cell array 153 is coupled to the address transition detecting circuit 100 through precharge MOS transistors 161 and 163. The memory cell array 153 includes memory cells 153-1 and 153-2, word lines W1 and W2 and a pair of bit lines B1 and barred B1. The word lines W1 and W2 are coupled to the memory cells 153-1 and 153-2 respectively. The pair of bit lines B1 and barred B1 are coupled to the memory cells 153-1 and 153-2. The gates of the MOS transistors 161 and 163 are commonly connected to the output terminal 109. The drains of the MOS transistors 161 and 163 are connected to the power supply. Each of the sources of the MOS transistors 161 and 163 is connected to the pair of bit lines B1 and barred B1 respectively. The memory cell array 153 is coupled to the decoder 181. The decoder 181 receives the address signals from the pair of address signal lines A1 and barred A1 and outputs a decode signal which designates the location of the memory cells 153-1 and 153-2 to the memory cell array 153.

The operation of the address transition detecting circuit of the present invention will now be explained.

Figure 2:
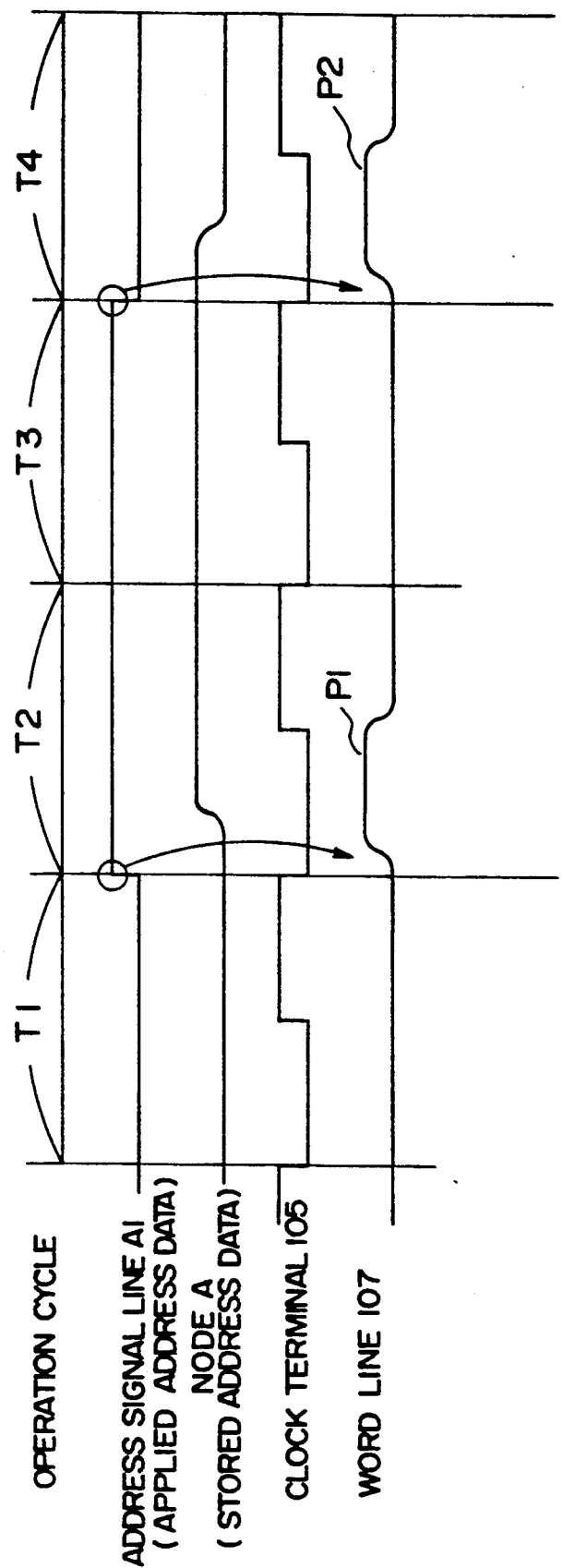
FIG. 2 is a time chart of an address transition detecting circuit according to the first embodiment of the present invention.

FIG. 2 shows a time chart of the address transition detecting circuit 100 shown in FIG. 1. FIG. 3 shows the address data, the state of transistors and electrical level of the output signal of the address transition detecting circuit. The address transition detecting circuit 100 has operation cycles T1 to T4 which are synchronized with the clock signal applied to the clock terminal 105. The address transition detecting circuit 100 operates synchronized with the clock signal.

(1) The first operation cycle T1

When the node A has a "L" level and the node B has a "H" level (hereinafter, the latch circuit 151 stores address data "0") and the address signal line A1 receives the "L" level address signal and address signal line barred A1 receives the "H" level address signal (hereinafter, the pair of address signal lines receives address data "0"), the MOS transistors 111, 117, 119, 129 and 131 are in the OFF state. Then, the word line 107 is in the "L" level.

The decoder 181 also receives the address data "0" and outputs a first decode signal which designates the location of the memory cell 153-1. The stored data in the memory cell 153-1 is read out to the pair of bit lines B1 and barred B1 in response to the first decode signal.

(2) The second operation cycle T2

At the beginning of the cycle T2, as the pair of address signal lines receives address data "1", the MOS transistor 127 changes into the OFF state and the MOS transistor 131 changes into the ON state. As the MOS transistors 131 and 133 are in the ON state, the power supply voltage level is applied to the word line 107 from the power supply voltage terminal. Therefore, the level of the word line 107 changes from the "L" level to the "H" level as shown in FIG. 2. Since the word line 107 changes into the "H" level, the MOS transistors 117 and 119 change into the ON state. As a result, the node A is applied to the "H" level signal from the address signal line A1 through the MOS transistor 117. Similarly, the node B is applied to the "L" level signal from the address signal line barred A1 through the MOS transistor 119. Therefore, the level of the node A changes from the "L" level to the "H" level and the level of the node B changes from the "H" level to the "L" level. That is, the stored address data in the latch circuit 151 is renewed. The latch circuit 151 stores the address data "1". Then, the MOS transistor 129 changes into the ON state in response to the "L" level signal on the node B. The MOS transistor 133 changes into the OFF state in response to the "H" level signal on the node A.

The decoder 181 also receives address data "1" and outputs a second decode signal which designates the location of the memory cell 153-2. As the MOS transistors 161 and 163 are in the ON state in response to the "H" level of the word line 107, the power supply voltage level is applied to the pair of bit lines B1 and barred B1 (precharging operation).

At the middle of the cycle T2, as the MOS transistor 111 changes into the ON state in response to the "H" level clock signal, the word line 107 is discharged to the "L" level. Therefore, the MOS transistors 117 and 119 change into the OFF state in response to the "L" level of the word line 107. From the beginning to the middle of the cycle T2, the word line 107 is in the "H" level. This "H" level pulse is an address transition pulse P1. The address transition pulse P1 indicates that the address signals applied to the pair of address signal lines was changed.

The MOS transistors 161 and 163 also change into the OFF state in response to the "L" level of the word line 107. As the MOS transistors 161 and 163 change into the OFF state, the precharging operation is finished. Therefore, the stored data in the memory cell 153-2 is read out to the pair of bit lines B1 and barred B1 in response to the second decode signal.

(3) The third operation cycle T3

The operation of the third operation cycle T3 is similar to that of the first operation cycle T1 except for the level of the address signals and the stored address data.

The MOS transistors 117, 119, 127 and 133 are in the OFF state and the MOS transistors 129 and 131 are in the ON state, since the level of the address signals does not change. Therefore, the level of the word line 107 is in the "L" level and the level of the nodes A and B also is in the "H" level.

Since the word line 107 is in the "L" level, the MOS transistors 161 and 163 are in the OFF state. The stored data in the memory cell 153-2 is read out again to the pair of bit lines B1 and barred B1 in response to the second decode signal without a precharging operation.

(4) The fourth operation cycle T4

At the beginning of the cycle T4, as the pair of address signal lines receive address data "0", the MOS transistor 127 changes into the ON state and the MOS transistor 131 changes into the OFF state. As the MOS transistors 127 and 129 are in the ON state, the power supply voltage level is applied to the word line 107 from the power supply voltage terminal. Therefore, the level of the word line 107 changes from the "L" level to the "H" level as shown in FIG. 2. As the word line 107 changes into the "H" level, the MOS transistors 117 and 119 change into the ON state. As a result, the node A is applied to the "L" level signal from the address signal line A1 through the MOS transistor 117. Similarly, the node B is applied to the "H" level signal from the address signal line barred A1 through the MOS transistor 119. Therefore, the level of the node A changes from the "H" level to the "L" level and the level of the node B changes from the "L" level to the "H" level. That is, the stored address data in the latch circuit 151 is renewed. The latch circuit 151 stores the address data "0". Then, the MOS transistor 129 changes into the OFF state in response to the "H" level signal on the node B. The MOS transistor 133 changes into the ON state in response to the "L" level signal on the node A.

The decoder 181 also receives the address data "0" and outputs the first decode signal. As the MOS transistors 161 and 163 are in the ON state in response to the "H" level of the word line 107, the power supply voltage level is applied to the pair of bit lines B1 and barred B1.

At the middle of the cycle T4, as the MOS transistor 111 changes in the ON state in response to the "H" level clock signal, the word line 107 is discharged to the "L" level. Therefore, the MOS transistors 117 and 119 change into the OFF state in response to the "L" level of the word line 107. From the beginning to the middle of the cycle T4, the word line 107 is in the "H" level. This "H" level pulse is an address transition pulse P2. The address transition pulse P2 indicates that the address signals received on the pair of address signal lines was changed.

The MOS transistors 161 and 163 also change into the OFF state in response to the "L" level of the word line 107. As the MOS transistors 161 and 163 change into OFF state, the precharging operation is finished. Therefore, the stored data in the memory cell 153-1 is read out to the pair of bit lines B1 and barred B1 in response to the first decode signal.

A second embodiment of the present invention will now be described with reference to FIG. 4 and FIG. 5.

Figure 4:
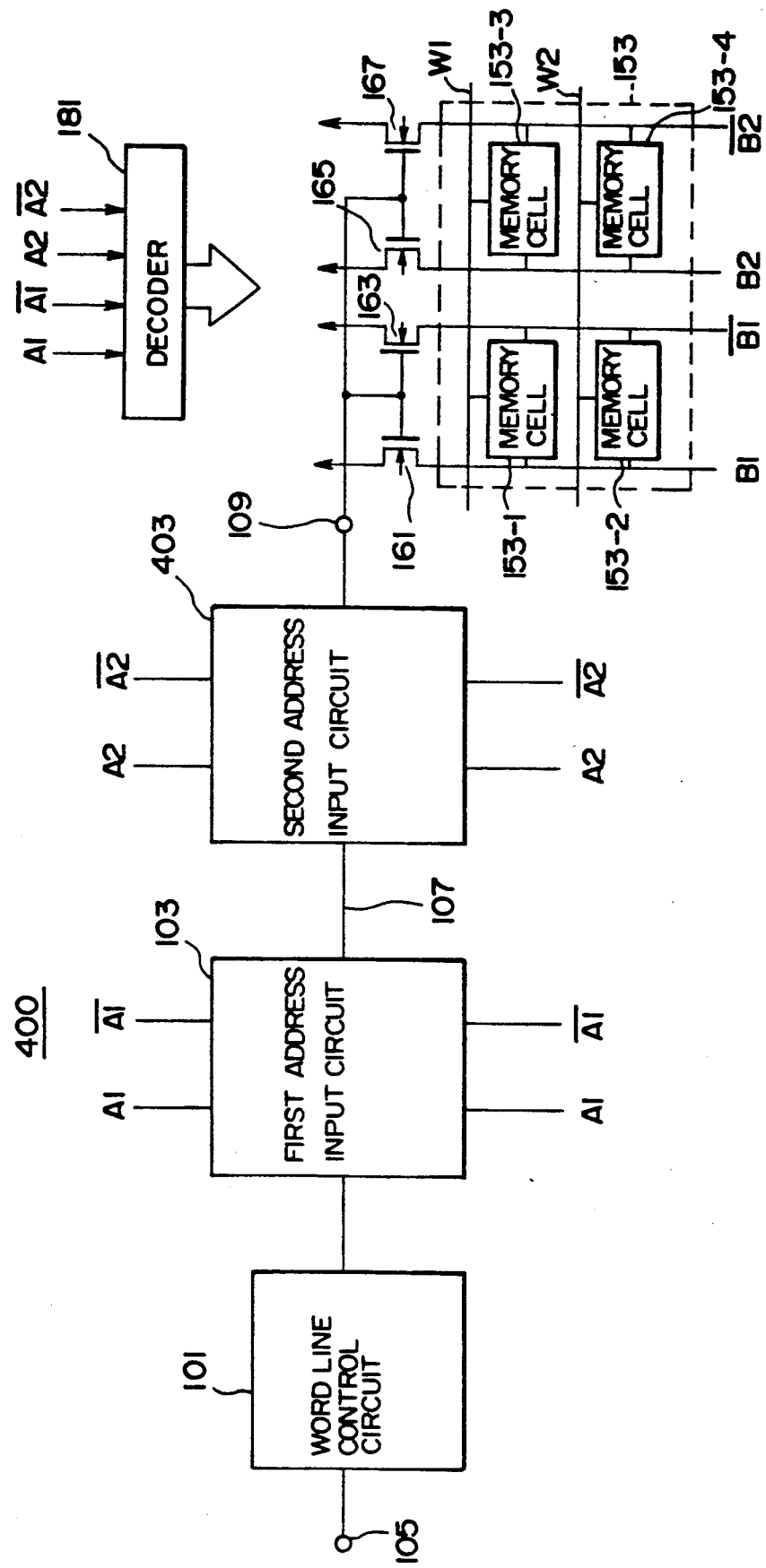
FIG. 4 is a block diagram showing an address transition detecting circuit according to a second embodiment of the present invention.

FIG. 4 is a circuit diagram showing the second embodiment of the present invention. The difference between the first embodiment and second embodiment is the number of address signals and the number of memory cells.

An address transition detecting circuit 400 has the word line control circuit 101, a first address input circuit 103 and a second address input circuit 403. The address transition detecting circuit 400 is coupled to the memory cell array 153. The second address input circuit 403 is connected to the first address input circuit 103 and output terminal 109 through the word line 107. The first and second address input circuits 103 and 403 have the same circuit construction as the address input circuit 103 shown in FIG. 1.

The memory cell array 153 is coupled to the address transition detecting circuit 400 through precharge MOS transistors 161, 163, 165 and 167. The memory cell array 153 includes four memory cells 153-1, 153-2, 153-3 and 153-4, word lines W1 and W2, two pairs of bit lines B1, barred B1, B2 and barred B2. The word line W1 is coupled to the memory cells 153-1 and 153-3. The word line W2 is coupled to the memory cells 153-2 and 153-4.

The pair of bit lines B1 and barred B1 are coupled to the memory cells 153-1 and 153-2. The pair of bit lines B2 and barred B2 are coupled to the memory cells 153-3 and 153-4. The gates of the MOS transistors 161 to 167 are commonly connected to the output terminal 109. The drains of the MOS transistors 161 to 167 are connected to the power supply. Each of the sources of the MOS transistors 161 and 163 is connected to the pair of bit lines B1 and barred B1 respectively. Each of the sources of the MOS transistors 165 and 167 is connected to the pair of bit lines B2 and barred B2 respectively. A first pair of address signal lines A1 and barred A1 are connected to the first address input circuit 103 and receive first address signals. Similarly, a second pair of address signal lines A2 and barred A2 are connected to the second address input circuit 403 and receive second address signals.

The decoder 181 receives the address signals from the pairs of address signal lines A1, barred A1, A2 and barred A2.

The operation of the address transition detecting circuit 400 will now be explained.

Figure 5:
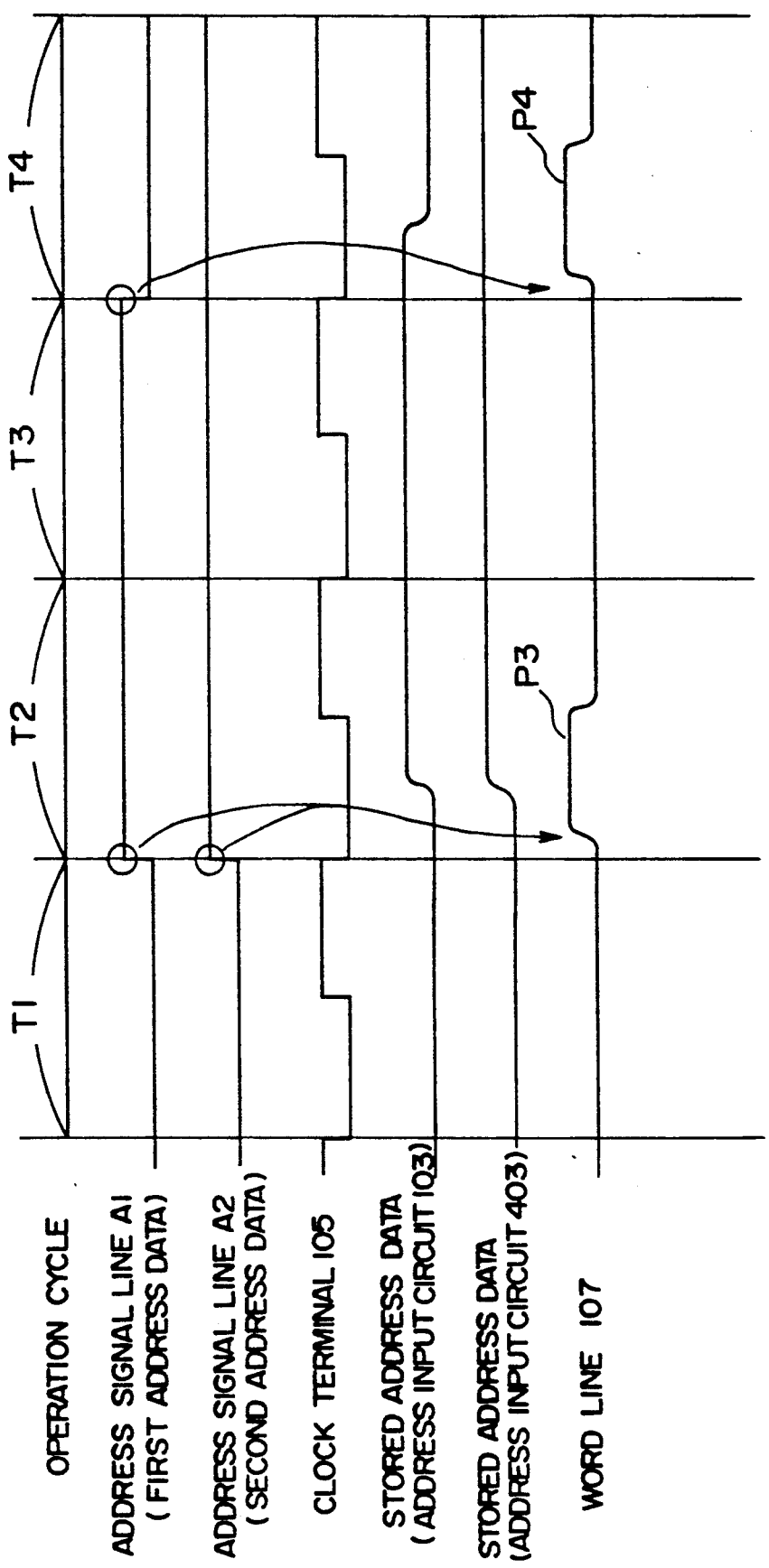
FIG. 5 is a time chart of an address transition detecting circuit according to the second embodiment of the present invention.
Figure 6:
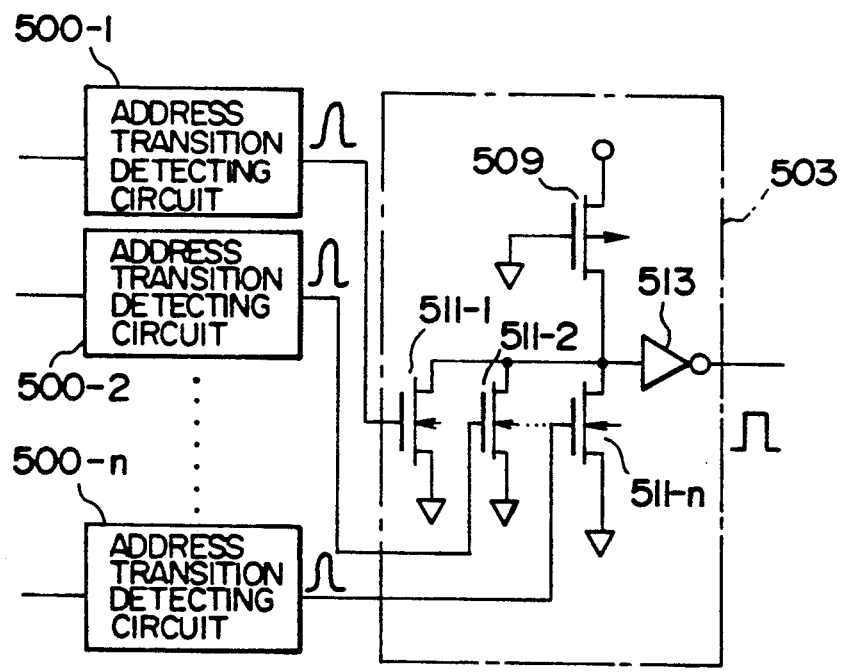
FIG. 6 is a circuit diagram showing a conventional address transition detecting circuit.
Figure 7:
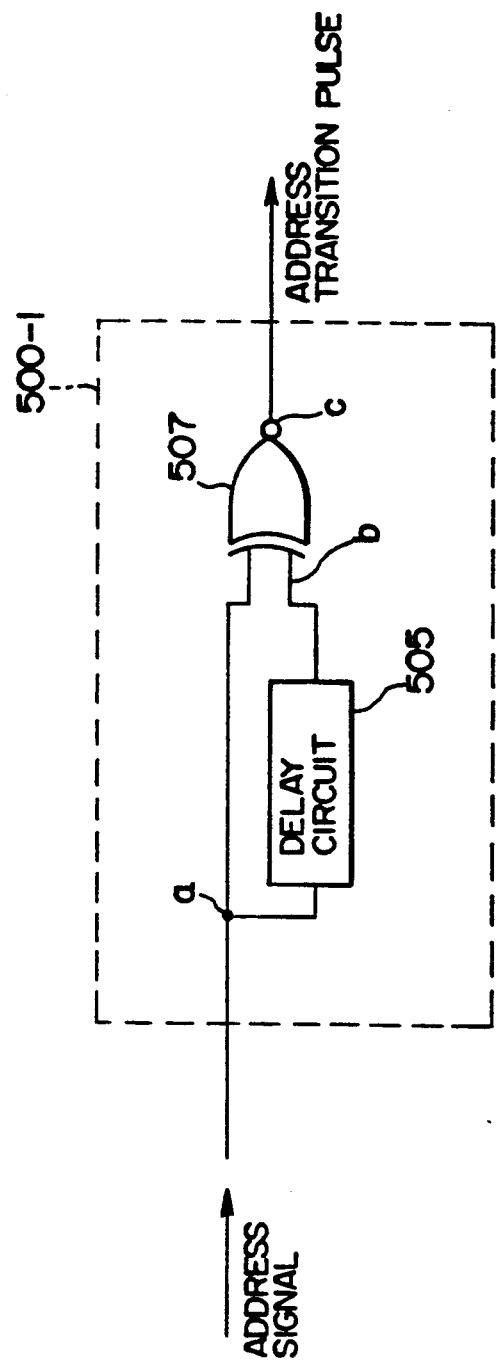
FIG. 7 is a circuit diagram of an address signal transition detecting circuit shown in FIG. 6.

FIG. 5 shows a time chart of the address transition detecting circuit 400 shown in FIG. 4. The address transition detecting circuit 400 has the same operation cycles T1 to T4.

(1) The first operation cycle T1

When the first and second address input circuits 103 and 403 store the first and second address data "0" respectively and the first and second pairs of address signal lines receive first and second address data "0" respectively, the word line 107 is in the "L" level.

The decoder 181 also receives the first and second address data "0" and outputs a first decode signal which designates the location of the memory cell 153-1. The stored data in the memory cell 153-1 is read out to the pair of bit lines B1 and barred B1 in response to the first decode signal.

(2) The second operation cycle T2

At the beginning of the cycle T2, as the first and second pairs of address signal lines receive the first and second address data "1" respectively, the level of the word line 107 changes from the "L" level to the "H" level as shown in FIG. 5. As a result, the stored address data in each of the first and second address input circuits 103 and 403 changes into "1" respectively. That is, the stored address data in each of the address input circuits 103 and 403 is renewed respectively.

The decoder 181 also receives the first and second address data "1" and outputs a second decode signal which designates the location of the memory cell 153-4. As the MOS transistors 161 to 167 are in the ON state in response to the "H" level of the word line 107, the power supply voltage level is applied to the pairs of bit lines B1, barred B1, B2 and barred B2.

At the middle of the cycle T2, the word line control circuit 101 discharges the word line 107 to the "L" level. From the beginning to the middle of the cycle T2, the word line 107 is in the "H" level. This "H" level pulse is an address transition pulse P3. The address transition pulse P3 indicates that either one of the first and second address signals (first and second address data) received on the pairs of address signal lines was changed.

Since the word line 107 is in the "L" level, the MOS transistors 161 to 167 are in the OFF state. The stored data in the memory cell 153-4 is read out to the pair of bit lines B2 and barred B2 in response to the second decode signal.

(3) The third operation cycle T3

The operation of the third operation cycle T3 is similar to that of the first operation cycle T1 except for the level of the address signals and the stored address data.

As each of the first and second address signals do not change, the level of the word line 107 also does not change.

Since the word line 107 is in the "L" level, the MOS transistors 161 to 167 are in the OFF state. The stored data in the memory cell 153-4 is read out again to the pair of bit lines B2 and barred B2 in response to the second decode signal without a precharging operation.

(4) The fourth operation cycle T4

At the beginning of the cycle T4, as the first address data changes into "0", the level of the word line 107 changes from the "L" level to the "H" level as shown in FIG. 5. As a result, the stored address data in the first address input circuit 103 is renewed.

The decoder 181 also receives the first address data "0" and second address data "1" and outputs a third decode signal which designates the location of the memory cell 153-3. As the MOS transistors 165 and 167 are in the ON state in response to the "H" level of the word line 107, the power supply voltage level is applied to the pair of bit lines B2 and barred B2.

At the middle of the cycle T4, the word line 107 is discharged to the "L" level. From the beginning to the middle of the cycle T4, the word line 107 is in the "H" level. This "H" level pulse is an address transition pulse P4. The address transition pulse P4 indicates that one of the address signals applied to the pairs of the first and second address signal lines was changed.

The MOS transistors 165 and 167 change into the OFF state in response to the "L" level of the word line 107. As the MOS transistors 165 and 167 change into OFF state, the precharging operation is finished. Therefore, the stored data in the memory cell 153-3 is read out to the pair of bit lines B2 and barred B2 in response to the third decode signal.

According to the present invention, as described above, the address transition detecting circuit has the address comparing circuit 115 and the address data storing circuit 113 both of which are directly connected to the word line 107. Therefore, the address transition detecting circuit does not need any OR circuits. Further, the address transition detecting circuit can detect the transition of the address data quickly.

While the invention has been particularly shown and described with reference to preferred embodiments thereof, it will be understood by those skilled in the art that various changes in form and details may be made therein without departing from the spirit and scope of the invention.

What is claimed is:

1. An address transition detecting circuit coupled to a word line and a pair of address signal lines which receives a pair of complementary address signals comprising:
   a word line control circuit coupled to the word line for discharging the word line;
   an address data storing circuit coupled to the word line and the pair of address signal lines for storing an address data in response to the address signals; and
   a comparing circuit coupled to the pair of address signal lines, the word line and the address data storing circuit for comparing the address signals with the stored address data in the address data storing circuit and for outputting an address transition signal to the word line in response to the result of the comparison.

2. An address transition detecting circuit according to claim 1, wherein said word line control circuit is an N-type MOS transistor having a gate coupled to a clock terminal, a source coupled to a ground and a drain coupled to the word line.

3. An address transition detecting circuit according to claim 1, wherein said address data storing circuit comprises:
   an address data memory cell for storing the address data; and
   a switching circuit coupled to the word line, the address data memory cell and the address signal line for coupling the address data memory cell and the address signal line in response to the address transition signal.

4. An address transition detecting circuit according to claim 1, wherein the address data storing circuit comprises:
   an address data memory cell having first and second data terminals for storing the address data;
   a first N-type MOS transistor having a gate coupled to the word line, a source coupled to one of the address signal lines and a drain coupled to the first data terminal; and
   a second N-type MOS transistor having a gate coupled to the word line, a source coupled to the other address signal line and a drain coupled to the second data terminal.

5. An address transition detecting circuit according to claim 4, wherein the address data memory cell comprises:
   a first inverter having an input terminal coupled to the second data terminal and an output terminal coupled to the first data terminal; and a second inverter having an input terminal coupled to the first data terminal and an output terminal coupled to the second data terminal.

6. An address transition detecting circuit according to claim 1, wherein the comparing circuit comprises:
   a first switching circuit coupled to one of the address signal lines, the word line and the address data storing circuit for outputting the address transition signal to the word line in response to one of the address signal and the stored address data in the address data storing circuit; and
   a second switching circuit coupled to the other address signal line, the word line and the address data storing circuit for outputting the address transition signal to the word line in response to the other address signal and the stored address data in the address data storing circuit.

7. An address transition detecting signal comprising:
   a word line;
   an address signal line for receiving an address signal;
   a word line control circuit coupled to the word line and a clock terminal for discharging the word line, said clock terminal receiving a clock signal; and
   a first address signal input circuit coupled to the word line, the address signal line and the word line control circuit for storing address data in response to the address signal and outputting a first address transition signal to the word line in response to the address signal and the stored address data.

8. An address transition detecting circuit according to claim 7, wherein said address signal input circuit comprises:

an address data storing circuit coupled to the word line and the address signal line for storing an address data in response to the first address signal; and a comparing circuit coupled to the address signal line, the word line and the address data storing circuit for comparing the address signal with the stored address data in the address data storing circuit and for outputting an address transition signal to the word line in response to the result of the comparison.

9. An address transition detecting circuit according to claim 8, wherein said address data storing circuit comprises:

an address data memory cell for storing the address data; and a switching circuit coupled to the word line, the address data memory cell and the address signal line for coupling the address data memory cell and the address signal line in response to the address transition signal.

10. An address transition detecting circuit according to claim 7 further comprising:

another address signal line for receiving another address signal;

another address signal input circuit coupled to the word line and said another address signal line for storing another address data in response to said another address signal and outputting another address transition signal to the word line in response to said another address signal and said another stored address data.

* * * * *